(12) United States Patent
Rooyackers et al.

(10) Patent No.: US 9,257,539 B2
(45) Date of Patent: Feb. 9, 2016

(54) METHOD FOR MANUFACTURING TRANSISTOR AND ASSOCIATED DEVICE

(71) Applicant: IMEC VZW, Leuven (BE)

(72) Inventors: Rita Rooyackers, Kessel-lo (BE); Nadine Collaert, Blanden (BE); Geert Eneman, Balen (BE)

(73) Assignee: IMEC VZW, Leuven (BE)

( * ) Notice: Subject to any disclaimer, the term of this patent is extended or adjusted under 35 U.S.C. 154(b) by 0 days.

(21) Appl. No.: 14/566,073

(22) Filed: Dec. 10, 2014

(65) Prior Publication Data

US 2015/0179755 A1 Jun. 25, 2015

(30) Foreign Application Priority Data

Dec. 20, 2013 (EP) ..................................... 13198829
Jan. 15, 2014 (EP) ..................................... 14151285

(51) Int. Cl.

| | |
|---|---|
| *H01L 21/00* | (2006.01) |
| *H01L 21/84* | (2006.01) |
| *H01L 21/336* | (2006.01) |
| *H01L 21/20* | (2006.01) |
| *H01L 21/36* | (2006.01) |
| *H01L 21/3205* | (2006.01) |
| *H01L 21/4763* | (2006.01) |
| *H01L 21/302* | (2006.01) |
| *H01L 21/461* | (2006.01) |
| *H01L 29/66* | (2006.01) |
| *H01L 29/423* | (2006.01) |
| *H01L 29/78* | (2006.01) |
| *H01L 29/786* | (2006.01) |
| *H01L 29/06* | (2006.01) |

(52) U.S. Cl.
CPC ........ *H01L 29/6681* (2013.01); *H01L 29/0673* (2013.01); *H01L 29/42392* (2013.01); *H01L 29/66545* (2013.01); *H01L 29/66553* (2013.01); *H01L 29/66818* (2013.01); *H01L 29/785* (2013.01); *H01L 29/7853* (2013.01); *H01L 29/78696* (2013.01)

(58) Field of Classification Search
None
See application file for complete search history.

(56) References Cited

U.S. PATENT DOCUMENTS

| | | | |
|---|---|---|---|
| 8,900,951 B1 * | 12/2014 | Cheng | ................. H01L 29/0673 257/E21.453 |
| 2005/0285149 A1 | 12/2005 | Chang et al. | |

(Continued)

FOREIGN PATENT DOCUMENTS

WO   WO2008/155208   12/2008

*Primary Examiner* — Hoang-Quan Ho
(74) *Attorney, Agent, or Firm* — Knobbe Martens Olson & Bear, LLP

(57) ABSTRACT

A method for manufacturing a transistor device is provided, comprising providing a plurality of parallel nanowires on a substrate; providing a dummy gate structure over a central portion of the parallel nanowires; epitaxially growing extension portions of a second material, selectively on the parallel nanowires, outside a central portion; providing a filler layer around and on top of the dummy gate structure and the extension portions; removing the dummy gate structure to create a gate trench, exposing the central portion of the parallel nanowires; providing spacer structures on the sidewalls of the gate trench, to define a final gate trench; thinning the parallel nanowires, thereby creating free space in between the nanowires and spacer structures; and selectively growing a quantum well layer on or around the parallel nanowires, at least partially filling the free space, to thereby provide a connection between the quantum well layer and extension portions.

7 Claims, 10 Drawing Sheets

(56) References Cited

U.S. PATENT DOCUMENTS

| | | | |
|---|---|---|---|
| 2006/0189043 A1* | 8/2006 | Schulz | H01L 29/42384 438/142 |
| 2007/0164373 A1 | 7/2007 | Ko et al. | |
| 2008/0315309 A1* | 12/2008 | Chang | H01L 29/66545 257/346 |
| 2009/0302372 A1* | 12/2009 | Chang | H01L 29/66545 257/327 |
| 2010/0252816 A1* | 10/2010 | Ko | H01L 29/66818 257/24 |
| 2010/0295022 A1* | 11/2010 | Chang | B82Y 10/00 257/24 |
| 2012/0156833 A1* | 6/2012 | Kawashima | H01L 29/0673 438/151 |
| 2012/0313170 A1* | 12/2012 | Chang | H01L 29/66545 257/347 |
| 2014/0217502 A1* | 8/2014 | Chang | H01L 29/78 257/347 |

\* cited by examiner

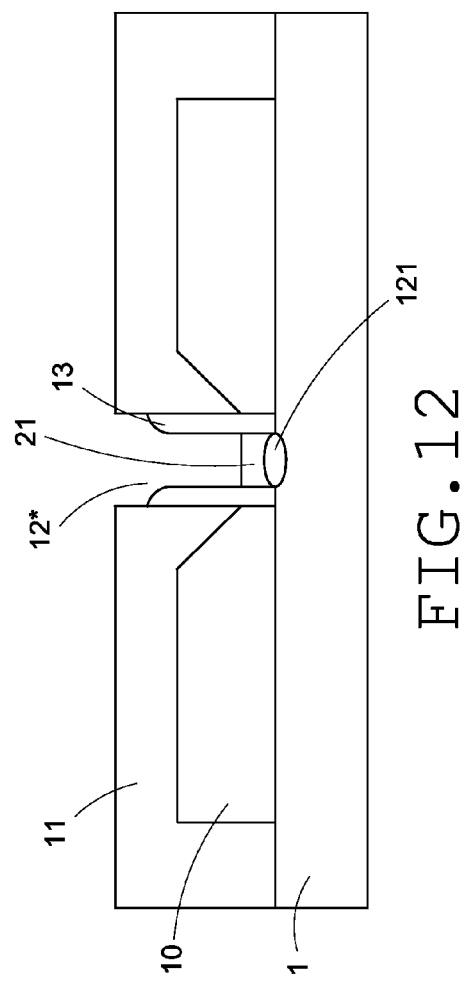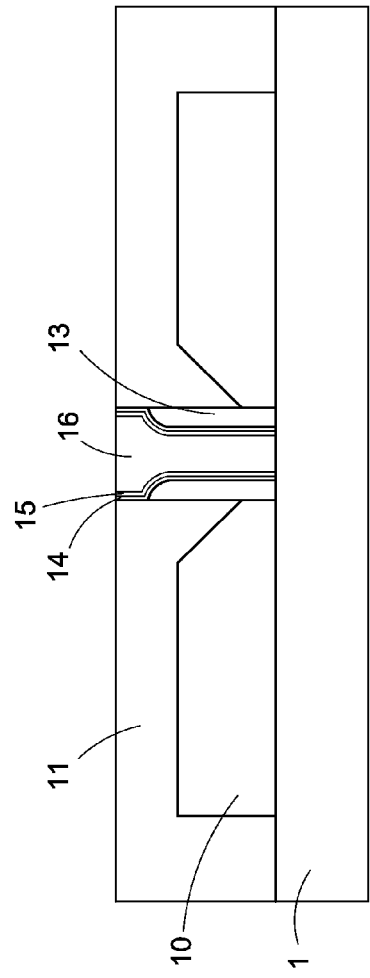

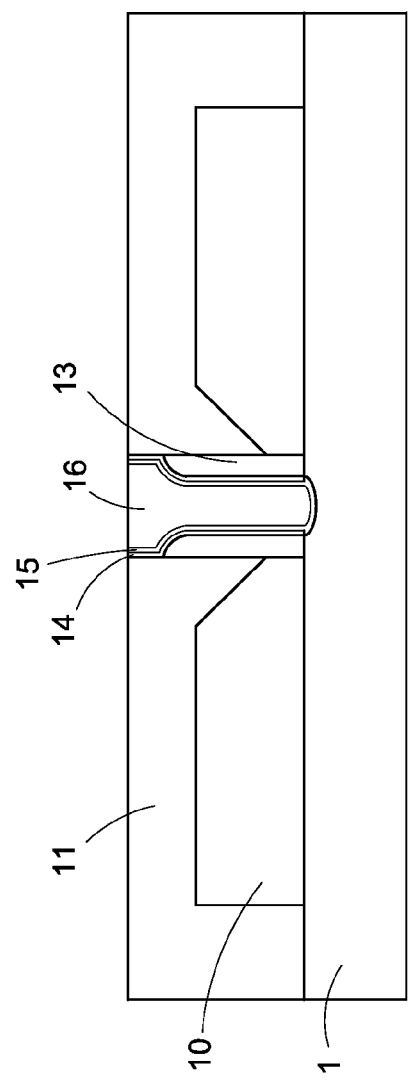

METHOD FOR MANUFACTURING TRANSISTOR AND ASSOCIATED DEVICE

INCORPORATION BY REFERENCE OF RELATED APPLICATIONS

Any and all priority claims identified in the Application Data Sheet, or any correction thereto, are hereby incorporated by reference under 37 CFR 1.57. This application claims the benefit of European Application No. EP 13198829.7 filed Dec. 20, 2013 and European Application No. EP 14151285.5 filed Jan. 15, 2014. Each of the aforementioned applications is incorporated by reference herein in its entirety, and each is hereby expressly made a part of this specification. The aforementioned application is incorporated by reference herein in its entirety, and is hereby expressly made a part of this specification.

TECHNICAL FIELD

The present disclosure relates to a method for manufacturing a transistor device, more specifically a multi-channel transistor device or a gate all around on nanowire device.

BACKGROUND ART

Fin field effect transistors (FINFETs) are an interesting transistor architecture because of, for instance, their fast switching times and high current densities. A FINFET device comprises a source, a drain, and one or more fin-shaped channel structures between the source and the drain. A gate electrode over the fin(s) regulates electron flow between the source and the drain.

In WO2008/155208, a method for fabricating a field effect transistor device is disclosed. A substrate is provided having a silicon layer thereon. A fin lithography hard mask is patterned on the silicon layer. A dummy gate structure is placed over a central portion of the fin lithography hard mask. A filler layer is deposited around the dummy gate structure. The dummy gate structure is removed to reveal a trench in the filler layer, centered over the central portion of the fin lithography hard mask, that distinguishes a fin region of the device from source and drain regions of the device. The fin lithography hard mask in the fin region is used to etch a plurality of fins in the silicon layer. The trench is filled with a gate material to form a gate stack over the fins. The filler layer is removed to reveal the source and drain regions of the device, wherein the source and drain regions are intact and self-aligned with the gate stack.

SUMMARY OF THE DISCLOSURE

There still exists a need for improved processes and associated devices in industry.

In a first aspect, a method is provided for manufacturing a transistor device, the method comprising:
 a. providing a plurality of parallel nanowires on a substrate, the nanowires having a first end and a second end, wherein the first ends and second ends are connected to each other by means of respective connection portions, both nanowires and connection portions comprising the same material;
 b. providing a dummy gate structure over a central portion of the parallel nanowires, thereby covering the central portion of the parallel nanowires;
 c. epitaxially growing extension portions of a second material, selectively on the parallel nanowires and the connection portions, outside of the central portion, and preferably such that an upper surface of the extension portions does not extend above an upper level of the dummy gate structure, thereby enlarging the extension region and thereby reducing the access resistance;
 d. providing a filler layer around and on top of the dummy gate structure and the extension portions;
 e. performing a flattening step of the filler layer, to thereby expose an upper surface of the dummy gate structure and preferably leave the upper surface of the extension portions covered by the filler layer;
 f. removing the dummy gate structure, in order to create a gate trench, exposing the central portion of the parallel nanowires;
 g. providing spacer structures on the sidewalls of the gate trench, to define a final, preferably T-shaped, gate trench, thereby lowering the aspect ratio for refilling the trench and the final gate contact resistance;
 h. thereafter, thinning the parallel nanowires, thereby creating free space in between the nanowires and the spacer structures, resulting in an extended exposed portion of said parallel nanowires;
 i. selectively growing a quantum well layer on or around the parallel nanowires, at least partially filling the free space, to thereby provide a connection between the quantum well layer and the respective extension portions.

According to certain embodiments, providing the parallel nanowires on a substrate comprises:
 j. providing a substrate having a silicon layer thereon;
 k. providing an oxide layer on the silicon layer, and patterning the oxide layer in order to define a plurality of rectangular reference structures;
 l. forming spacer structures around the reference structures;
 m. using the spacer structures as a hard mask for patterning the nanowires in the silicon layer.

According to certain embodiments, the method comprises, or further comprises performing an under-etch of the nanowires or the thinned nanowires in the final gate trench and at least partially underneath the spacers, before selectively growing a quantum well layer on or around the extended exposed portion of said parallel nanowires.

According to certain embodiments, the under-etch of the nanowires occurs during the thinning process of the parallel nanowires.

According to certain embodiments, providing spacer structures on the sidewalls of the gate trench comprises providing a spacer material covering the sidewalls of the gate trench and the parallel nanowires, and etching back all of the spacer material from the parallel nanowires, leaving all or at least a lower portion of the sidewalls of the gate trench covered with the spacer material.

According to certain embodiments, the spacer material is also removed from an upper portion of the sidewalls of the gate trench.

According to certain embodiments, a thickness of the spacer structures at a level just above the free space is smaller than the thickness reduction of an upper surface of the nanowires during the thinning of the parallel nanowires, before selectively growing a quantum well layer on or around the parallel nanowires, i.e. around the extended exposed portion thereof, in the final gate trench and underneath the spacers. It is an advantage that the extension portions can then easily be brought in contact with the quantum well.

According to certain embodiments, the method further comprises filling the final gate trench with a gate material stack.

In a second aspect, a semiconductor device is provided, comprising:
- a plurality of parallel nanowires on a substrate, the nanowires having a first end and a second end, wherein the first ends and second ends are connected to each other by means of respective connection portions, both nanowires and connection portions comprising the same material;
- epitaxially grown extension portions (also called junction portions) of a second material, on the parallel nanowires and the connection portions, outside of a central portion of the parallel nanowires;
- a filler layer around and on top of the dummy gate structure and the extension portions, the filler layer not covering the central portion of the nanowires, and the filler layer defining a trench suitable as gate trench over the nanowires;
- spacer structures on the sidewalls of the trench, defining a final gate trench, preferably a T-shaped final gate trench (cross-section in a direction parallel with the nanowires and perpendicular on the substrate comprises a T-shaped profile defined by the gate trench narrowed down at its lower portion by said spacer structures);
- wherein the semiconductor device comprises a space in between the nanowires and the spacer structures, the space providing a connecting pathway between the respective extension portions and the final gate trench.

According to certain embodiments, the semiconductor device comprises a quantum well layer on or around the parallel nanowires, at least partially or completely filling the space, thereby providing a connection between the quantum well layer and the respective extension portions. The connection is thus made through the spacer structures. The above connection can be seen as a physical connection, for instance a connection wherein a continuous, preferably single, layer is formed by the quantum well layer in the final trench, the quantum well layer within the spacer, and the extension portions.

BRIEF DESCRIPTION OF THE DRAWINGS

The disclosure will be further elucidated by means of the following description and the appended figures.

FIGS. 1 to 16 illustrate a preferred process flow and associated devices according to certain embodiments.

FIG. 1 illustrates an initial configuration of an intermediately processed semiconductor substrate/device.

FIG. 2 illustrates a patterned dummy oxide layer in dummy fin structures.

FIG. 3 illustrates spacer structures formed around the dummy fin structures.

FIG. 4 illustrates a further resist layer to be patterned.

FIG. 5 illustrates structures defined by patterning the resist layer.

FIG. 6 illustrates a dummy gate structure formed over a central portion of parallel nanowires.

FIG. 7 illustrates extension portions formed by selective epitaxial growth.

FIG. 8 illustrates a filler layer applied over the wafer and embedding the dummy gate structure and extension portions.

FIG. 9 illustrates the exposed dummy gate structure.

FIG. 12 illustrates underetched material under the nanowires resulting in voids.

FIGS. 13 and 14 illustrate a metal gate layer or layer stack which are each categorized as a gate all-around architecture.

DETAILED DESCRIPTION OF PREFERRED EMBODIMENTS

Figure 2:
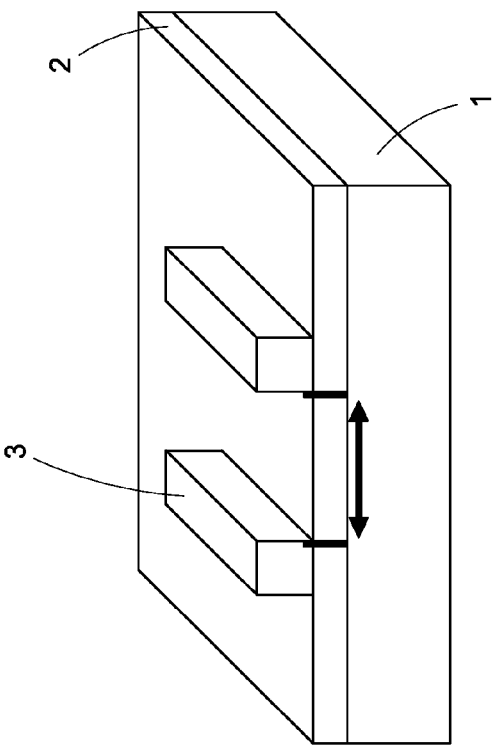

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the disclosure.

Furthermore, the terms first, second, third and the like in the description and in the claims, are used for distinguishing between similar elements and not necessarily for describing a sequential or chronological order. The terms are interchangeable under appropriate circumstances and the embodiments of the disclosure can operate in other sequences than described or illustrated herein.

Moreover, the terms top, bottom, over, under and the like in the description and the claims are used for descriptive purposes and not necessarily for describing relative positions. The terms so used are interchangeable under appropriate circumstances and the embodiments of the disclosure described herein can operate in other orientations than described or illustrated herein.

Furthermore, the various embodiments, sometimes referred to as "preferred" or "certain", are to be construed as exemplary manners in which the disclosure may be implemented rather than as limiting the scope of the disclosure.

Figure 1:
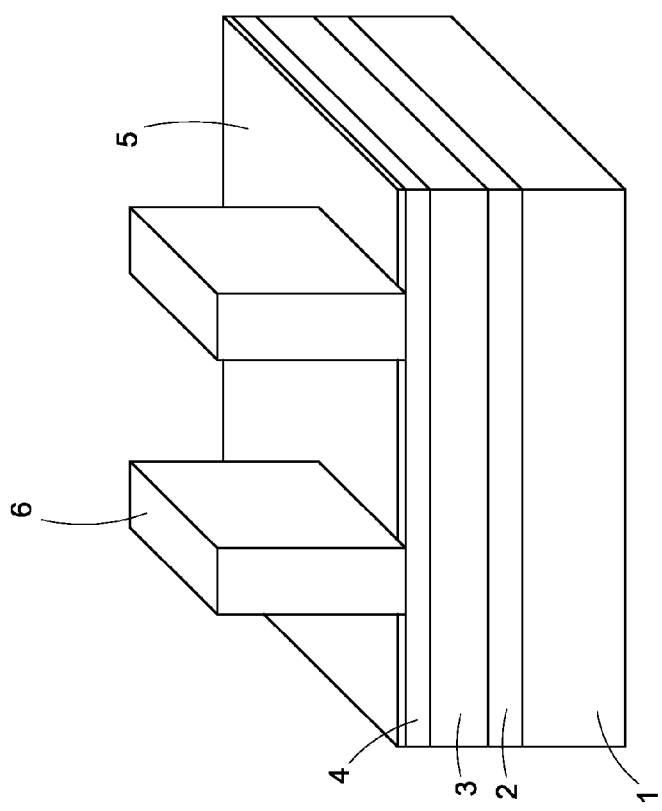

FIG. 1 illustrates a possible initial configuration of an intermediately processed semiconductor substrate/device. A silicon layer 2 is provided for instance on a buried oxide layer 1 (for instance a silicon oxide layer). The buried oxide layer can for instance be provided on a silicon substrate (not depicted). The silicon layer on top of the buried oxide layer 1 on top of the silicon substrate can constitute a standard silicon on insulator (SOI) substrate or wafer as it is known to the skilled person. Alternatively, instead of the SOI substrate, a Germanium on insulator substrate or III-V material on insulator substrate can also be used.

On top of the silicon layer 2 (or Germanium or III-V layer; for the purpose of the present description reference is further made to a Silicon layer 2 only), a dummy active layer 3 is deposited. This dummy active layer can be for instance a silicon oxide layer 3. The dummy active layer is patterned according to state of the art techniques in to dummy fin structures. For instance an advanced patterning film (APF)/Silicon Oxide-Carbon (SiOC) layer (4,5) can be provided, after which a photoresist layer 6 may be applied and patterned. The presence of the APF/SIOC layer may reduce possible reflectivity problems and result in an optimally defined spacing between the dummy fins, which impact the dimensions of the nanowires that will be produced later in the process. The working of multichannel transistor devices is known to depend strongly on the definition of the nanowire structures. The patterned photoresist layer 6 is used to pattern the APF/SiOC layer (SiOC layer on top of APF), which on its turn (or channels) is used to pattern the dummy oxide layer 3 in dummy fin structures, the result of which is illustrated in FIG. 2. After etching the SiOC layer, the resist may be stripped during the dry etch of the APF layer, for instance due to a limited selectivity of the etch recipe.

Figure 3:
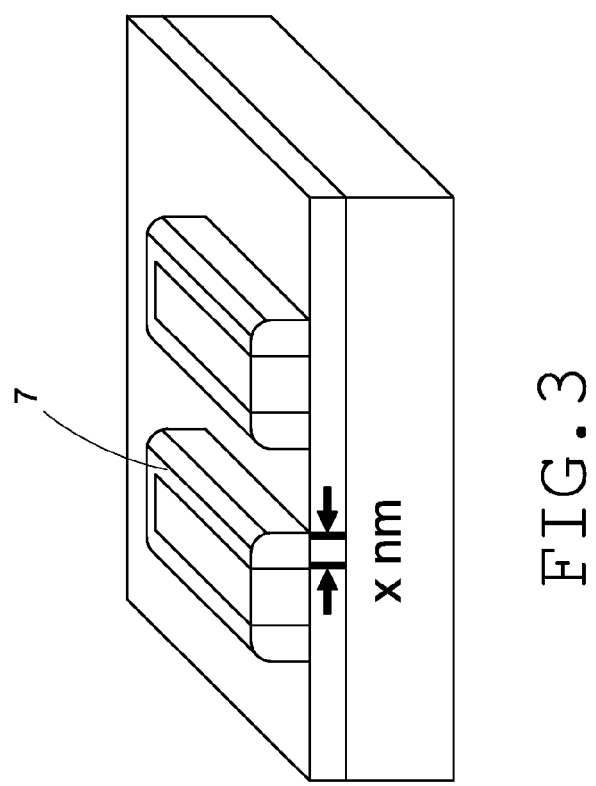

As illustrated in FIG. 3, spacer structures 7 are now formed around the dummy fin structures. The spacer can for instance comprise or consist of SiN, and can be formed with or without spacer liner. The thickness of the spacer structures 7 will eventually define the initial width of the nanowires to be formed in the silicon layer 2. According to preferred embodiments the width of the spacer structures 7 is about equal or equal as the thickness of the silicon layer 2. This provides the advantage that wires can more easily be formed.

Figure 5:
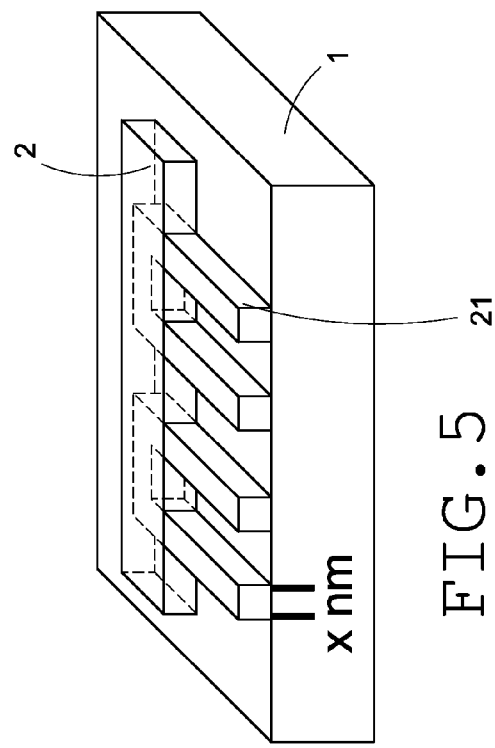
Figure 4:
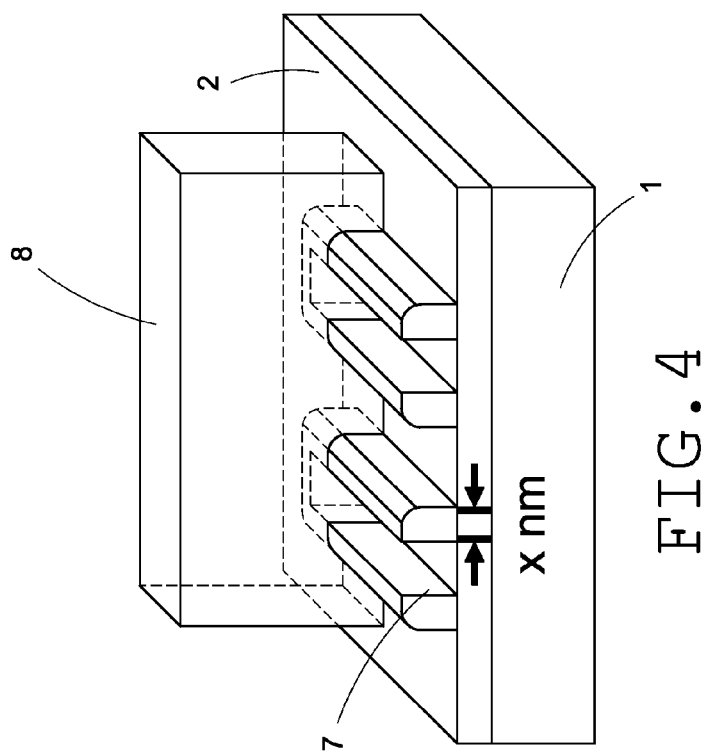

Next, the final patterning process of the nanowires 21 (channel structures) can be performed. It includes removing (e.g. by etching) the dummy fin structures. A further resist layer 8 can be applied and patterned in order to define source/drain pads, and possibly other structures (see FIG. 5) such as active regions for capacitors or single transistor structures with more relaxed dimensions. The source/drain pads are connection structures or portions which are connecting the respective first ends and second ends of the nanowire structures. The spacer structures 7, optionally the further defined source/drain pads and, if present, other structures are then used as a mask to define structures in the silicon layer 2. The defined structures preferably include or consist of the nanowire structures 21 and source/drain pads (or connection portions). Depending on the number of dummy fin structures, a predetermined number of nanowires 21 can be defined. It is an advantage but not a necessity, that the distance between the nanowires can be very well controlled.

Figure 6:
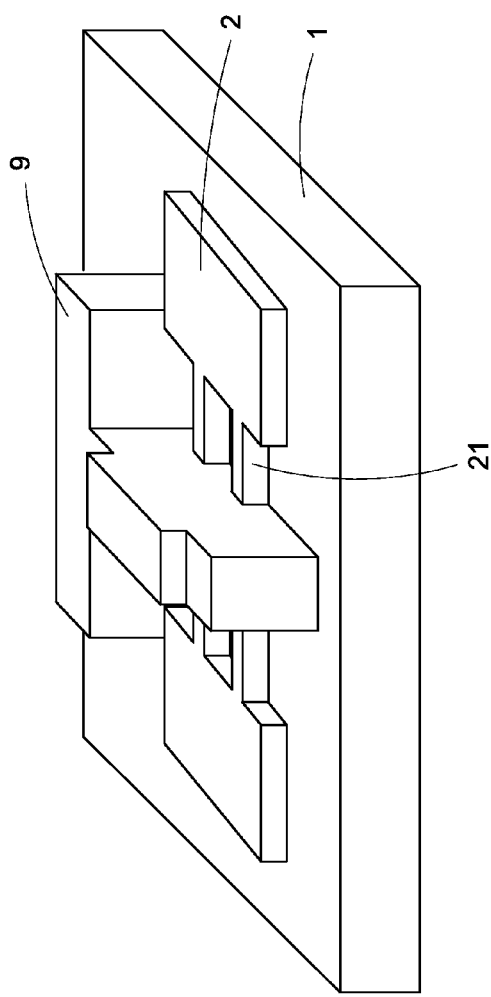

A dummy gate structure 9 is now formed, preferably perpendicularly, over a central portion of the, preferably parallel, nanowires 21, as illustrated in FIG. 6. Before patterning the dummy gate, a planarization step can be applied to avoid topography at the upper surface of the dummy gate structures (not shown). Hereby a gate last or removable gate approach (RMG) is in fact applied. This can be performed with patterning steps known to the skilled person. The central portion of the nanowires is now covered and thus protected by the dummy gate structure. The dummy gate structure 9 can for instance be an amorphous carbon dummy gate structure. It may comprise any other dummy gate material which would be considered suitable by the skilled person. The dummy gate material is preferably such that epitaxial growth of the extension regions can be done selectively towards the dummy gate and that the dummy gate can be removed selectively towards the other materials used in the integration process.

Figure 7:
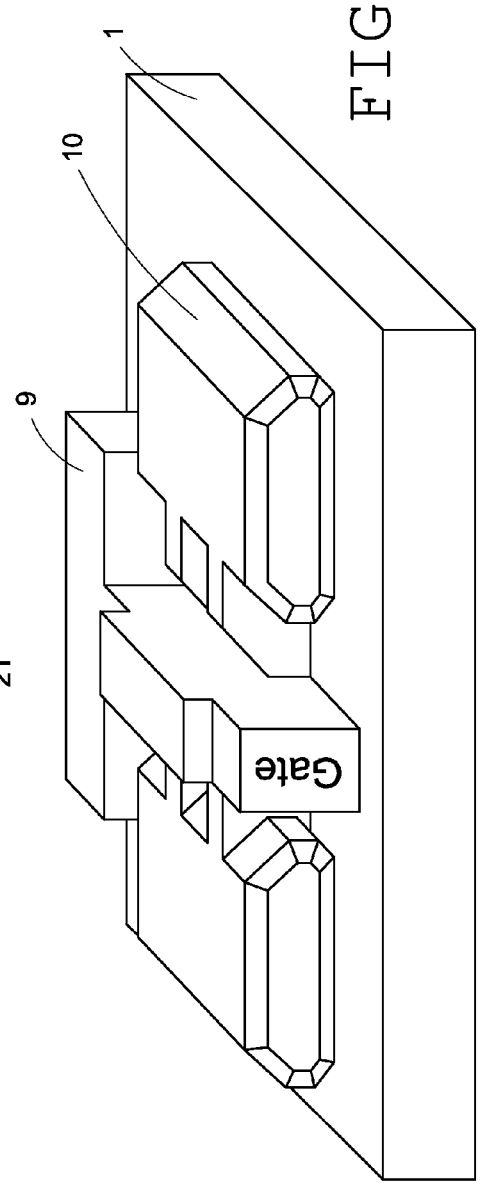

Selective epitaxial growth (SEG) of extension portions 10 is now performed, as illustrated in FIG. 7. The extension portion 10 can for instance comprise or consist of doped silicon or silicon germanium or Ge or III-V materials. The extension portions may induce stress on the source/drain pads and/or the exposed portion of the nanowires 21, the positive effects of which on device performance are known to the skilled person.

Figure 8:
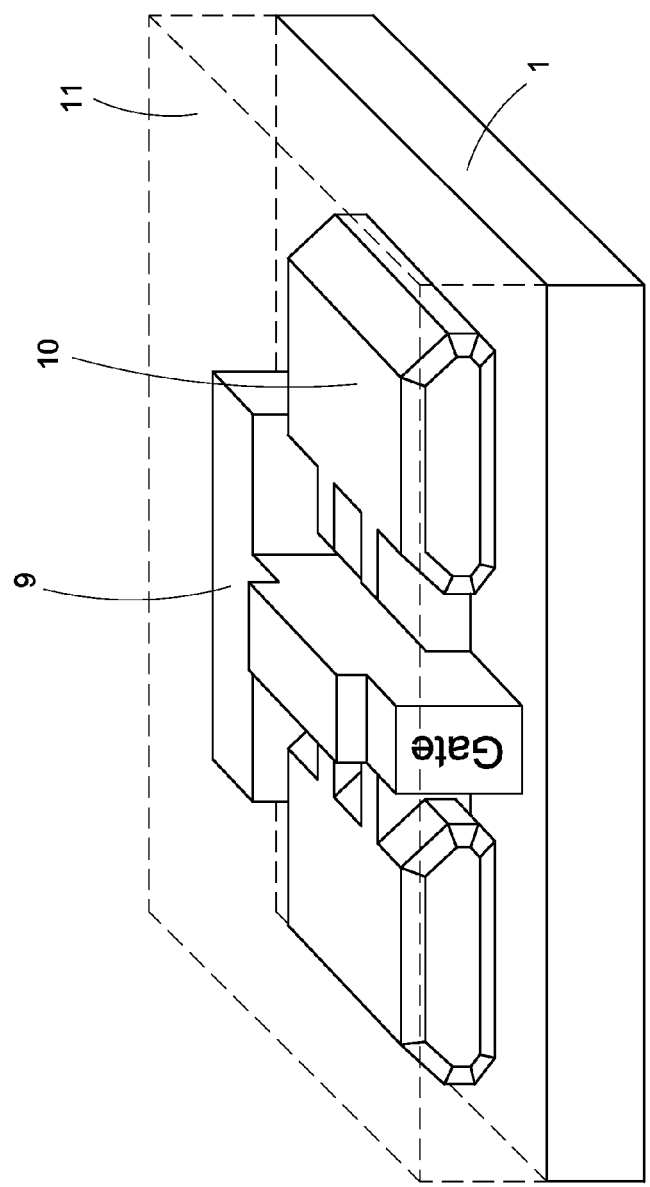

A filler layer is then applied over the wafer, as illustrated for instance in FIG. 8, embedding the dummy gate structure 9 and extension portions 10. The filler layer can for instance be a silicon oxide layer, low-k materials, polymer layers like BCB (BenzoCycloButene), and layers which are commonly used by the skilled person in III-V flows. The filler layer 11 hereby preferably fully covers the upper surface of the processed wafer, including the upper surface of the dummy gate structure 9.

Figure 9:
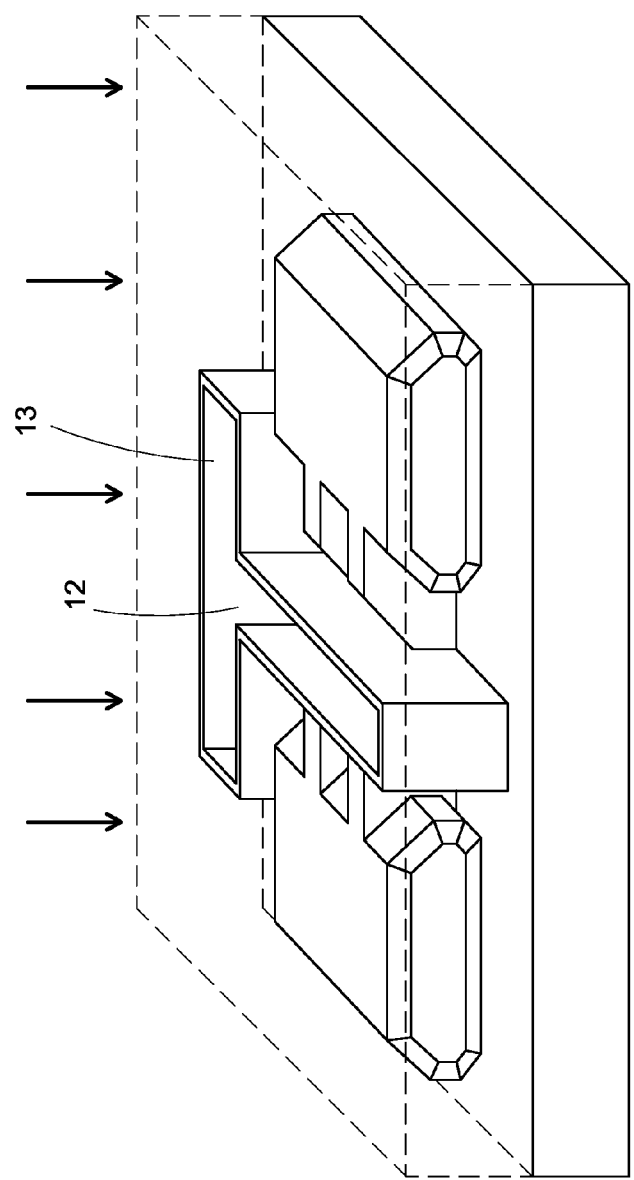

A flattening step is applied on the filler layer 11, for instance a chemical mechanical polishing step (CMP), to expose the dummy gate structure 9 again, as illustrated in FIG. 9. Preferably the extension portions 10 are hereby not yet exposed. This can be controlled by providing a dummy gate structure 9 with a height, i.e. a level of its upper surface, which is higher than the expected (can be controlled or pre-determined) height of the extension portions 10.

Now, the exposed dummy gate structure 9 can be selectively removed with respect to the filler layer 11. A gate trench 12 is hereby formed. Within the gate trench, internal spacer structures 13 are now formed. These spacer structures can comprise or consist of SiN, or any material found suitable by the skilled person. The use of these internal spacer structures 13, allows narrowing down the critical dimension of the gate, which is directly related to the thickness (and the control thereof) of the internal spacer structures (13). The spacer structures define a final gate trench 12*. According to preferred embodiments, the material of the spacer structures is deposited not only on the sidewalls of the gate trench 12, but also in other areas within the gate trench 12. An anisotropic etch back process can then be applied to remove excess of spacer material and leave only the sidewalls of the gate trench covered with spacer material. A process similar to the anisotropic dry etch back process which is commonly used to create spacers at gate sidewalls can be used, preferably comprising a timed overetch. According to preferred embodiments, for instance after the anisotropic (e.g. dry) etch back step, the upper portion of the sidewalls of the gate trench also results uncovered from spacer material, i.e. the upper portion of the sidewalls of the gate trench remains free from spacer material. This provides the advantage that the final gate metal layer or layer stack will have a "T"-shaped cross-section (illustrated schematically as "T"), which is an advantage for the deposition of the gate stack (reduced aspect ratio and less steep sidewalls) as well as for the resistance of the gate pads.

Figure 10B:
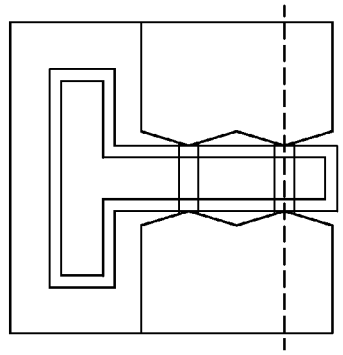
FIGS. 10A and 10B illustrate a cross-sectional view (FIG. 10A) along the dotted line in the reference drawing (FIG. 10B) at the level of the nanowire.
Figure 11B:
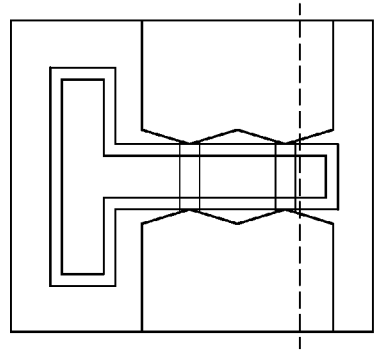
FIGS. 11A and 11B illustrate a cross-sectional view (FIG. 11A) along the dotted line in the reference drawing (FIG. 11B) at the level next to the nanowire.
Figure 10A:
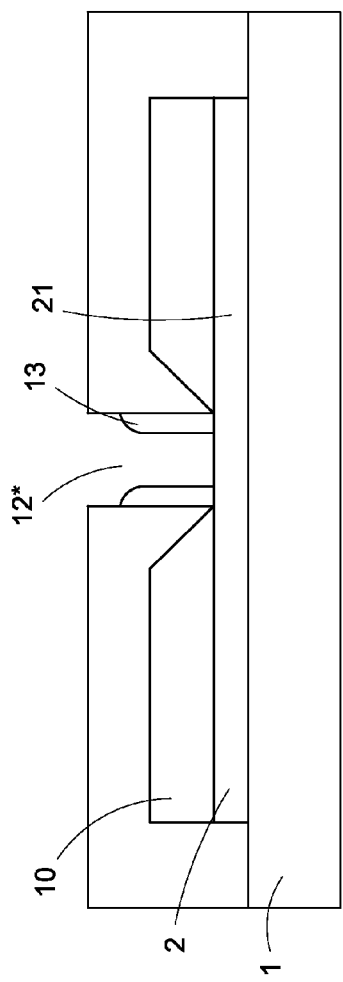
Figure 11A:
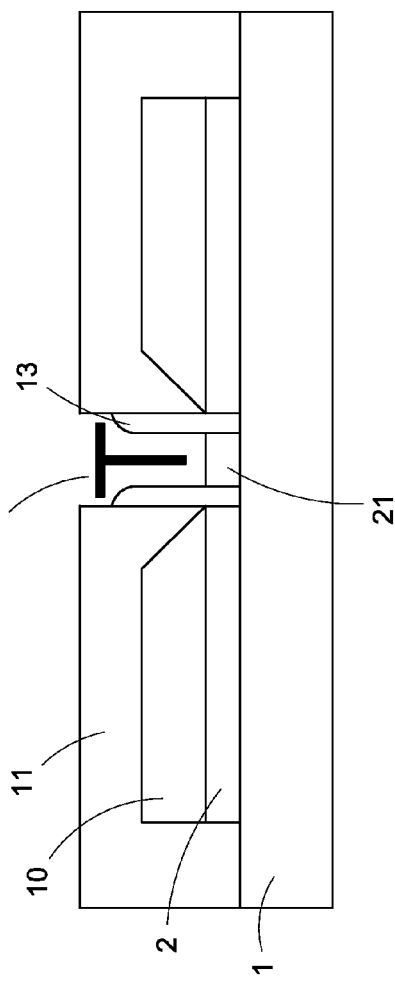
Figure 15B:
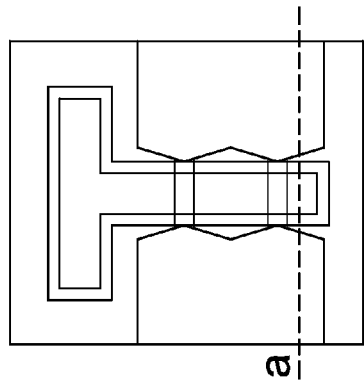
FIGS. 15A and 15B illustrate openings or voids created between nanowire structures and internal spacer structures in a cross-sectional view (FIG. 15A) along the dotted line in the reference drawing (FIG. 15B) at the level of the nanowire.

Cross-sectional views along respective dotted lines in the reference drawings of FIGS. 10B and 11B, show, in FIGS. 10A and 11A, the final result at the level of the nanowire and at the level next to the nanowire respectively. At this stage, the internal spacers 13 protect the nanowire portions which are embedded by the internal spacers directly, and further protect the portion of the nanowires which are located outside the gate trench 12 and under the extension portions 10. Also, the extension portions 12 are isolated from the gate final trench 12* by means of the spacer structures 13 and the nanowire portions embedded by the spacer structures 13.

Now, a thinning step can be applied on the nanowires, which reduces the dimensions, such as width and/or thickness thereof and can result in rounded corners. Preferably such a thinning step is conformal. The thinning step allows the nanowires to be made thinner than in the state of the art. A good control of the thinning step is preferred. An example of a suitable thinning step for silicon nanowires 21 can be for instance an HCl vapor phase based etching step or a baking step in H2 at low pressure. For III-V nanowire materials, a so-called digital etch can be used; alternating oxidation and oxide etch back steps which are highly selective towards oxide. This etching step will, for instance, not easily, or less easily, etch the silicon oxide, while easily and efficiently etching the silicon of the nanowires 21. Note that the thinning step may result in the nanowires becoming free-standing, i.e. the nanowires 21 may be under etched within the nanowire material when performing the thinning step, such that voids 121 may be created on the lower side of/below the thinned nanowire structures.

According to preferred embodiments, a separate step of underetching the material below the nanowire structures can be applied, before or after the nanowire thinning step, resulting in voids 121 which extend, or also extend in the underlying layer, for instance the oxide layer 1. This is illustrated in FIG. 12. FIGS. 13 and 14 illustrates the further process of providing a metal gate layer or layer stack 14, 15, 16 which can be categorized as a gate all-around architecture. For instance, a first layer 14 can be a gate dielectric (e.g., HfO2, Al2O3, or the like) layer. A second layer 15 can be a metal gate (e.g., TiN, TiAl, or the like) layer. A third layer can be the gate trench filling material (e.g., W, Al, or the like). Other suitable material systems are known to the skilled person.

Figure 16B:
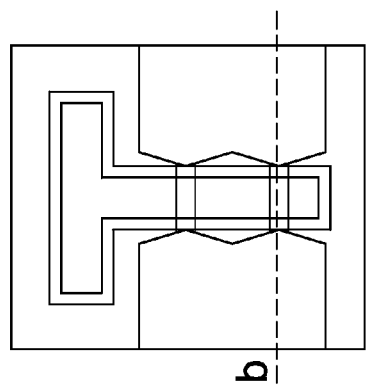
FIGS. 16A and 16B illustrate openings or voids created between nanowire structures and internal spacer structures in a cross-sectional view (FIG. 16A) along the dotted line in the reference drawing (FIG. 16B) at the level next to the nanowire.
Figure 15A:
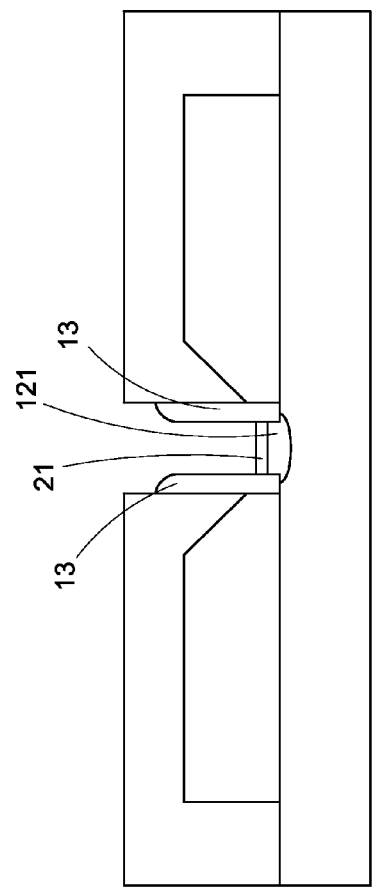
Figure 16A:
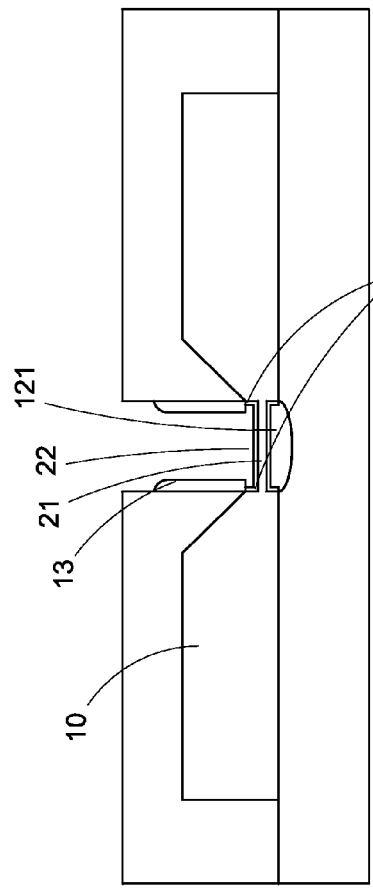

When performing the nanowire thinning process, free space 122, e.g., openings or voids are created, between the nanowire structures 21 and the internal spacer structures 13. This is illustrated in FIGS. 15A and 16B and FIGS. 16A and 16B. Indeed, the internal spacer structures 13 will less or not be affected, i.e., not substantially etched, during the nanowire thinning process. The nanowire itself will though be reduced in thickness and/or width, and will thereby separate from the originally embedding interface with the spacer structure 13.

It is an advantage of the controlling of the thickness of the spacer structures 13 and of the thinning of the nanowire structures, that a pathway can be created, embodied for instance as a free space or opening 122, between the final gate trench and the extension portions 10.

According to certain embodiments, the method further comprises selectively growing a quantum well layer on or around the parallel nanowires. This selective growth preferably extends also within the free space 122, such that a material of the quantum well layer finally gets in contact with the material of the extension portion 10. This provides the advantage that the extension regions are in contact with the high mobility channel whereby the access resistance is reduced. The material of the quantum well layer is preferably similar or of the same constitution as the material of the extension portion 10, and can be for instance a silicon germanium layer.

According to certain embodiments, the thickness of the spacer structures, and thus the spacer formation and spacer etch back processes need to be controlled accordingly in order to allow a pathway to be formed and in order to allow filling of the pathway by the one or more quantum well layers. Preferably, the final thickness is smaller than half of the thickness of the nanowire thinning target: e.g. when shrinking a nanowire dimension as for instance its width, with 10 nm, the target thickness for the spacers is about half thereof, thus about 5 nm. According to preferred embodiments, the thickness of the spacer structures at a level just above the free space is predetermined such that it is smaller than the (intended/foreseen) thickness reduction of an upper surface of the nanowires during the thinning of the parallel nanowires.

According to certain embodiments, a further undercut step can be applied, for instance a HF based etch step, to undercut the wires to create a gate all around or an omega gate device after the quantum well layer is formed.

Unless otherwise defined, all terms (including technical and scientific terms) are to be given their ordinary and customary meaning to a person of ordinary skill in the art, and are not to be limited to a special or customized meaning unless expressly so defined herein. It should be noted that the use of particular terminology when describing certain features or aspects of the disclosure should not be taken to imply that the terminology is being re-defined herein to be restricted to include any specific characteristics of the features or aspects of the disclosure with which that terminology is associated. Terms and phrases used in this application, and variations thereof, especially in the appended claims, unless otherwise expressly stated, should be construed as open ended as opposed to limiting. As examples of the foregoing, the term 'including' should be read to mean 'including, without limitation,' 'including but not limited to,' or the like; the term 'comprising' as used herein is synonymous with 'including,' 'containing,' or 'characterized by,' and is inclusive or open-ended and does not exclude additional, unrecited elements or method steps; the term 'having' should be interpreted as 'having at least;' the term 'includes' should be interpreted as 'includes but is not limited to;' the term 'example' is used to provide exemplary instances of the item in discussion, not an exhaustive or limiting list thereof; adjectives such as 'known', 'normal', 'standard', and terms of similar meaning should not be construed as limiting the item described to a given time period or to an item available as of a given time, but instead should be read to encompass known, normal, or standard technologies that may be available or known now or at any time in the future; and use of terms like 'preferably,' 'preferred,' 'desired,' or 'desirable,' and words of similar meaning should not be understood as implying that certain features are critical, essential, or even important to the structure or function of the invention, but instead as merely intended to highlight alternative or additional features that may or may not be utilized in a particular embodiment of the invention. Likewise, a group of items linked with the conjunction 'and' should not be read as requiring that each and every one of those items be present in the grouping, but rather should be read as 'and/or' unless expressly stated otherwise. Similarly, a group of items linked with the conjunction 'or' should not be read as requiring mutual exclusivity among that group, but rather should be read as 'and/or' unless expressly stated otherwise.

It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

All numbers expressing quantities of ingredients, reaction conditions, and so forth used in the specification are to be understood as being modified in all instances by the term 'about.' Accordingly, unless indicated to the contrary, the numerical parameters set forth herein are approximations that may vary depending upon the desired properties sought to be obtained. At the very least, and not as an attempt to limit the application of the doctrine of equivalents to the scope of any claims in any application claiming priority to the present application, each numerical parameter should be construed in light of the number of significant digits and ordinary rounding approaches. Where a range of values is provided, it is understood that the upper and lower limit, and each intervening value between the upper and lower limit of the range is encompassed within the embodiments.

All references cited herein are incorporated herein by reference in their entirety. To the extent publications and patents or patent applications incorporated by reference contradict the disclosure contained in the specification, the specification is intended to supersede and/or take precedence over any such contradictory material.

What is claimed is:

1. A method for manufacturing a transistor device, comprising:
    providing a plurality of parallel nanowires on a substrate, each nanowire having a first end and a second end, wherein the first end and the second end of each nanowire are connected to each other by a connection portion, wherein the plurality of nanowires and the connection portions comprise a same material;
    providing a dummy gate structure over a central portion of the parallel nanowires, thereby covering the central portion of the parallel nanowires;
    epitaxially growing extension portions selectively on the parallel nanowires and the connection portions, outside of the central portion of the parallel nanowires, wherein the extension portions comprise a second material;
    providing a filler layer around and on top of the dummy gate structure and the extension portions;
    flattening the filler layer, whereby an upper surface of the dummy gate structure is exposed;
    removing the dummy gate structure, whereby a gate trench is created and whereby the central portion of the parallel nanowires is exposed;
    providing spacer structures on sidewalls of the gate trench, whereby a final gate trench is defined; thereafter,
    thinning the parallel nanowires, whereby free space in between the nanowires and the spacer structures is created, resulting in an extended exposed portion of the parallel nanowires; and
    selectively growing a quantum well layer on or around the parallel nanowires, at least partially filling the free space, whereby a connection between the quantum well layer and respective extension portions is provided.

2. The method of claim 1, wherein the providing the plurality of parallel nanowires on the substrate comprises:
    providing a substrate having a silicon layer thereon;
    providing an oxide layer on the silicon layer;
    patterning the oxide layer, whereby a plurality of rectangular reference structures are provided;
    forming spacer structures around the reference structures; and
    using the spacer structures as a hard mask for patterning the nanowires in the silicon layer.

3. The method of claim 1, further comprising, before the selectively growing the quantum well layer, performing an under-etch of the nanowires or the thinned nanowires in the final gate trench and underneath the spacers.

4. The method of claim 1, wherein providing spacer structures on the sidewalls of the gate trench comprises providing a spacer material covering the sidewalls of the gate trench and the parallel nanowires, and etching back all of the spacer material from the parallel nanowires, leaving all or at least a lower portion of the sidewalls of the gate trench covered with the spacer material.

5. The method of claim 4, further comprising removing the spacer material from an upper portion of the sidewalls of the gate trench.

6. The method of claim 1, wherein, before the selectively growing the quantum well layer, a thickness of the spacer structures at a level just above the free space is smaller than a thickness reduction of an upper surface of the nanowires during the thinning of the parallel nanowires.

7. The method of claim 1, further comprising filling the final gate trench with a gate material stack.

* * * * *